United States Patent [19]
Sato

[11] Patent Number: 5,517,524
[45] Date of Patent: May 14, 1996

[54] METHOD OF AND APPARATUS FOR AUTOMATIC EQUALIZING FILTER

[75] Inventor: Teruo Sato, Kanagawa, Japan

[73] Assignee: Sony Corporation, Tokyo, Japan

[21] Appl. No.: 203,968

[22] Filed: Mar. 1, 1994

[30] Foreign Application Priority Data

Mar. 1, 1993 [JP] Japan ................................. 5-040071

[51] Int. Cl.$^6$ ..................................................... H03H 7/30
[52] U.S. Cl. ........................... 375/230; 375/231; 375/232
[58] Field of Search ................................... 375/12, 13, 14, 375/230, 231, 232; 364/724.19, 724.2; 333/18, 28 R

[56] References Cited

U.S. PATENT DOCUMENTS

| | | | |
|---|---|---|---|
| 4,575,857 | 3/1986 | Murakami | 375/230 |
| 5,251,233 | 10/1993 | Labedz et al. | 375/230 |
| 5,327,496 | 7/1994 | Russell et al. | 380/6 |

*Primary Examiner*—Stephen Chin
*Assistant Examiner*—Huong Luu
*Attorney, Agent, or Firm*—Jerry A. Miller

[57] ABSTRACT

The present invention is intended to converge tap coefficients of an equalizer at high speed with high accuracy by a small number of calculations. An automatic equalizing filter of the invention comprises a synchronizing data detecting circuit for detecting a synchronizing portion from a data sequence of a reception signal, an equalizer, a tap coefficient determining for determining tap coefficients ($C_0, C_1, C_2, \ldots, C_n$) of the equalizer and an impulse response estimating for estimating an impulse response on the basis of a cross-correlation function provided between the synchronizing portion and a previously-designated synchronizing pattern, thereby setting initial values of the tap coefficients ($C_0, C_1, C_2, \ldots, C_n$) of the equalizer on the basis of the impulse response estimated from this impulse response estimating.

6 Claims, 6 Drawing Sheets

FIG. 4

| TIME AXIS | IMPULSE RESPONSE (hi) | SYNC. PATTERN (x) | RECEPTION SIGNAL (SYNC. DATA PORTION) (y) | CROSS-CORRELATION FUNCTION (x AND y) |
|---|---|---|---|---|
| −15 |  |  | −0.80000 | −0.08077 |
| −14 |  |  | −0.80000 | 0.03846 |
| −13 |  | −1.00000 | −0.20000 | −0.08077 |
| −12 |  | −1.00000 | −1.80000 | −0.02308 |
| −11 |  | 1.00000 | −0.10000 | 0.04231 |
| −10 |  | −1.00000 | −0.50000 | −0.30769 |
| −9 |  | −1.00000 | −1.50000 | 0.19615 |
| −8 |  | 1.00000 | 1.50000 | −0.38462 |
| −7 |  | −1.00000 | −0.50000 | 0.11923 |
| −6 |  | 1.00000 | −1.21000 | −0.17692 |
| −5 |  | 1.00000 | −0.10000 | 0.08846 |
| −4 |  | 1.00000 | 0.50000 | −0.07692 |
| −3 |  | −1.00000 | −1.50000 | 0.07308 |
| −2 | 0.80000 | −1.00000 | −1.50000 | 0.77692 |
| −1 | 0 | −1.00000 | −0.50000 | −0.03462 |
| 0 | 1.00000 | −1.00000 | −2.10000 | 1.00000 |
| 1 | 0 | 1.00000 | −0.10000 | 0.04321 |
| 2 | 0.30000 | −1.00000 | −2.10000 | 0.23846 |
| 3 |  | −1.00000 | 0.10000 | 0.07308 |
| 4 |  | −1.00000 | −2.10000 | −0.07692 |
| 5 |  | 1.00000 | −0.10000 | 0.08846 |
| 6 |  | −1.00000 | −0.50000 | −0.33077 |
| 7 |  | −1.00000 | −1.50000 | 0.19615 |
| 8 |  | 1.00000 | 1.50000 | −0.38462 |
| 9 |  | −1.00000 | −0.50000 | 0.11923 |
| 10 |  | 1.00000 | 2.10000 | −0.11538 |
| 11 |  | 1.00000 | 0.70000 | −0.03462 |
| 12 |  | 1.00000 | 1.30000 | −0.06154 |
| 13 |  |  | 0.30000 | −0.08077 |
| 14 |  |  | 0.30000 | 0.23077 |
| 15 |  |  |  | −0.08077 |

METHOD OF AND APPARATUS FOR AUTOMATIC EQUALIZING FILTER

BACKGROUND OF THE INVENTION

1. Field of the Invention

The present invention relates to a method of and apparatus for automatic equalizing filter in a time division multiple access system for use in a digital mobile communication system, such as mobile telephone or the like.

2. Description of the Related Art

In the U.S.A., European countries and Japan, mobile telephone systems that are a kind of mobile communication systems have hitherto been digitized. It is known that this digital mobile telephone system uses a time division multiple access (TDMA) system.

In European countries, there is used a GSM (group special mobile) system that is a kind of TDMA systems.

In this GSM system, a communication channel from a base station to a mobile station (automobile) has a frame format shown in FIG. 1A. As shown in FIG. 1A, 8 time slots, each being formed of 156.25 bits, constitute a unit frame of 1250 bits which correspond to 4,615 msec.

One time slot is formed of a sync. (synchronizing) data portion of 26 bits disposed at substantially the center of one slot and digital data portions of 58 bits disposed ahead of and behind the sync. data portion or the like as shown in FIG. 1B.

In the GSM system, there are designated in advance 8 kinds of data sequences as the sync. pattern of this sync. data portion. FIG. 1C shows one of such 8 data sequences.

In the mobile communication system, such as the mobile telephone or the like, it is frequently observed that a tall building or the like is interposed between a mobile station moving at high speed and a base station. In this case, the mobile communication system is easily affected by a so-called multipath. When the mobile communication system is affected by the multipath, there occur intersymbol interference and interchannel interference, thereby deteriorating a transmission characteristic between the base station and the mobile station considerably. Therefore, it becomes impossible to receive a transmitted communication with small transmission error. In addition, this equivalent transmission characteristic fluctuates from hour to hour.

In such mobile communication system, the use of an equalizer becomes indispensable for minimizing transmission errors. In this case, tap coefficients of a digital filter that constructs this equalizer must be determined at high speed with high accuracy. Further, the transmission with small transmission error should preferably be implemented using simple hardware or using minimal computations as possible or with a calculation amount as small as possible.

OBJECTS AND SUMMARY OF THE INVENTION

It is therefore an object of the present invention to determine a tap coefficient of a digital filter constructing an equalizer at high speed with high accuracy by a small amount of calculation.

It is another object of the present invention to provide an improved apparatus for automatic equalizing filter in a time division multiple access system for use in a digital mobile communication system such as a mobile telephone.

According to an aspect of the present invention, there is provided an apparatus for automatic equalizing filter in a time division multiple access system. The apparatus for automatic equalizing filter includes a synchronizing data detecting circuit for detecting a synchronizing data portion from a data sequence of a reception signal, an equalizer, a tap coefficient determining circuit for determining tap coefficients of the equalizer, and an impulse response estimating circuit for estimating an impulse response from a cross-correlation function between the synchronizing data portion and a previously-designated synchronizing pattern, thereby setting initial values of tap coefficients of the equalizer on the basis of the impulse response estimated from the impulse response estimating circuit.

In the apparatus for automatic equalizing filter in a time division multiple access system according to the present invention, the tap coefficients of the equalizer corresponding to the cross-correlation function between the synchronizing data portion and the synchronizing pattern in the impulse response estimating circuit are calculated in advance, the tap coefficients are stored in the memory, and the tap coefficients are read out from the memory on the basis of the cross-correlation function calculated by the impulse response estimating circuit and then set upon reception.

According to the present invention, the cross-correlation function between the synchronizing data portion from the data sequence of the reception signal and the previously-estimated synchronizing pattern is calculated, the impulse response is estimated from the cross-correlation function and then the initial value of the tap coefficients of the equalizer is set. This initial value is very close to the optimum value and therefore the tap coefficients of the equalizer can be converged at high speed with high accuracy by a small amount of calculation.

Furthermore, according to the present invention, the tap coefficients of the equalizer corresponding to the cross-correlation function between the synchronizing data portion of the data sequence of the reception signal and the previously-designated synchronizing pattern are calculated in advance. The tap coefficients thus calculated are stored in the memory and the tap coefficients are read out from the memory on the basis of the cross-correlation function between the synchronizing data portion of the data sequence of the reception signal and the previously-designated synchronizing pattern upon reception, thereby setting the tap coefficients of the equalizer. Therefore, the tap coefficients of the equalizer can be determined at high speed with high accuracy by a small amount of calculation.

The above and other objects, features, and advantages of the present invention will become apparent from the following detailed description of illustrative embodiments thereof to be read in conjunction with the accompanying drawings.

BRIEF DESCRIPTION OF THE DRAWINGS

FIG. 4 is a characteristic diagram used to explain the automatic equalizing filter shown in FIG. 2;

DETAILED DESCRIPTION OF THE PREFERRED EMBODIMENTS

Figures 1A, 1B, 1C:
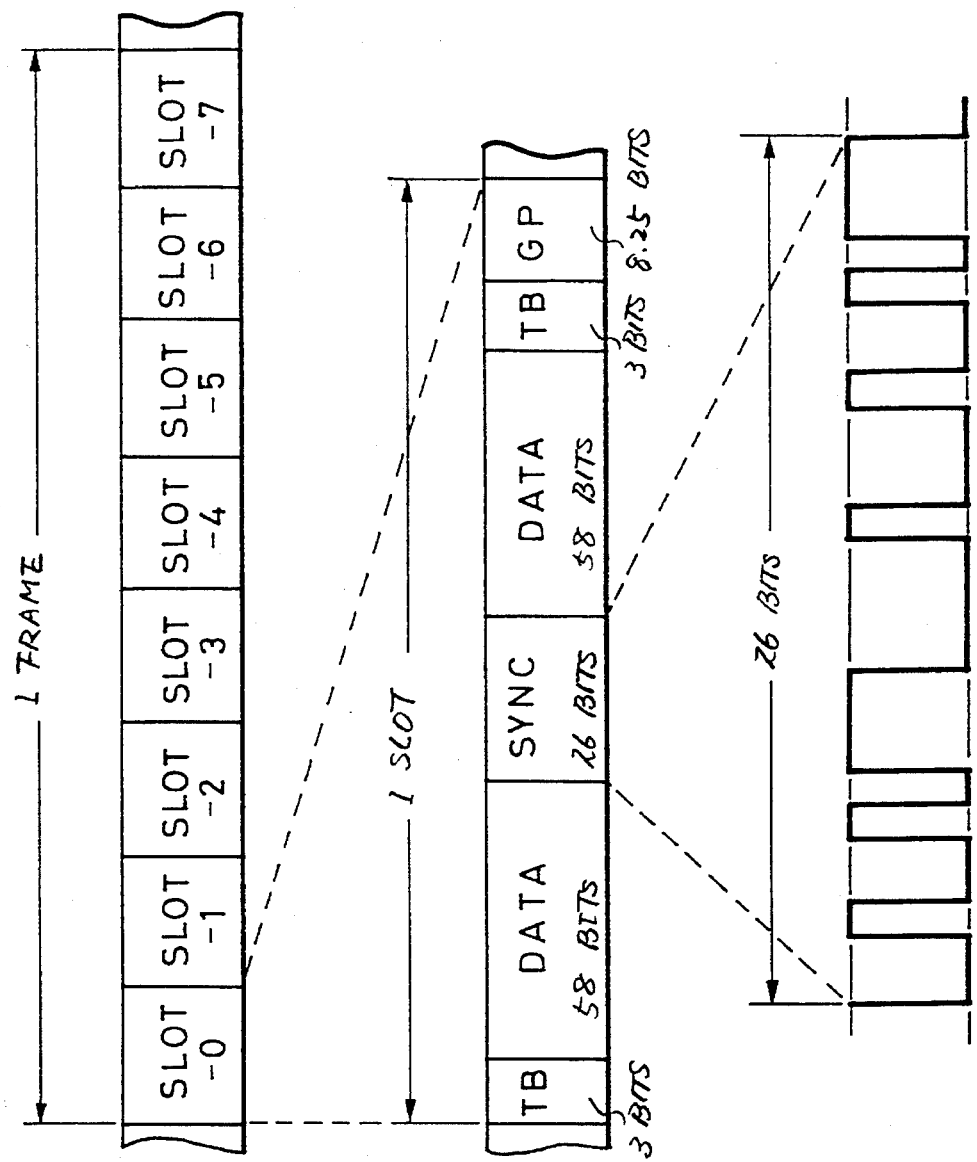
FIGS. 1A through 1C are diagrams showing an arrangement of a communication channel used in a mobile communication system according to the related art, respectively.

Referring to the drawings in detail, and initially to FIGS. 2 to 4, an apparatus for providing an automatic equalizing filter in the time division multiplex access system according to a first embodiment of the present invention will be described below.

Figure 2:
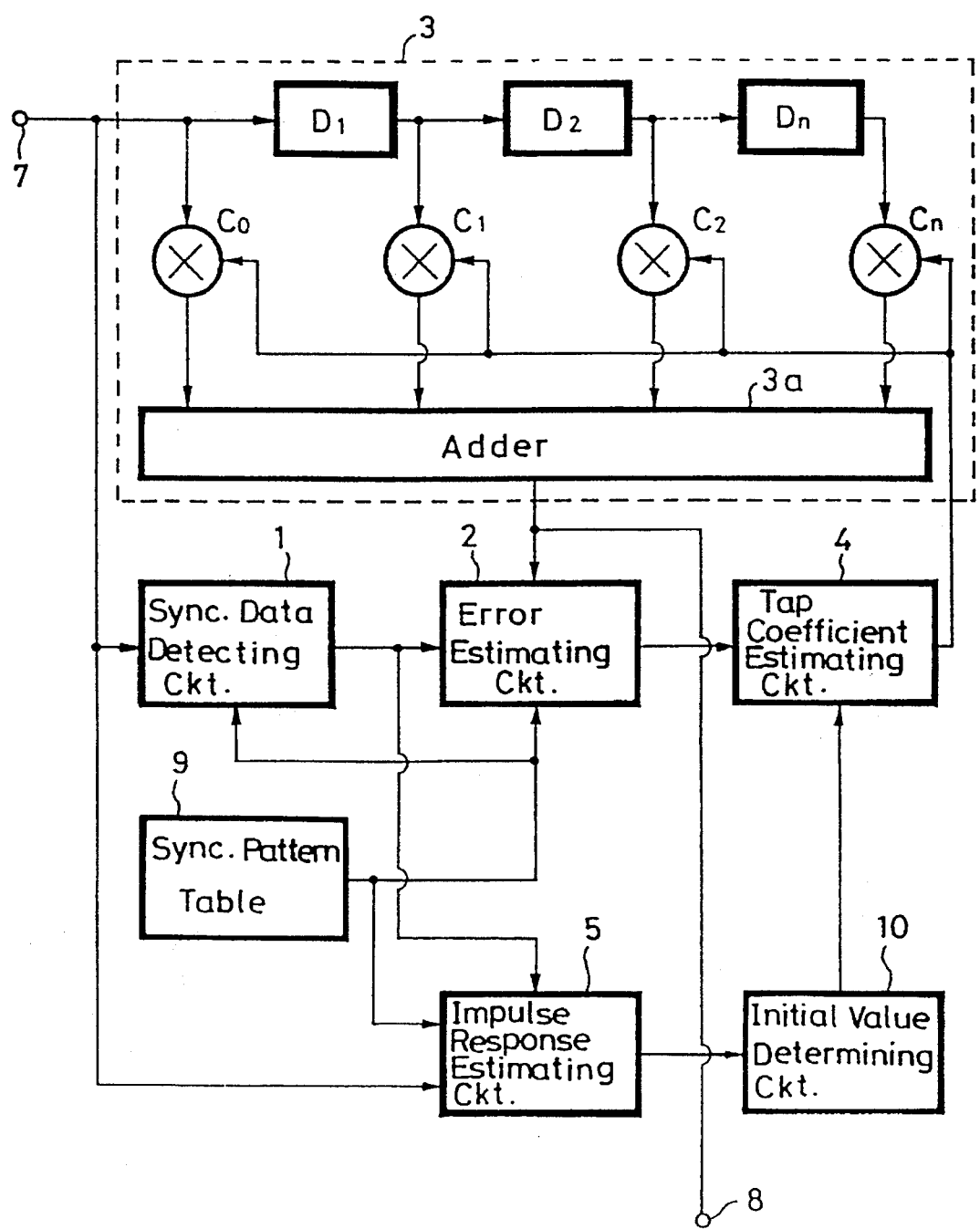
FIG. 2 is a block diagram showing a circuit arrangement of an automatic equalizing filter used in a time division multiple access system according to an embodiment of the present invention.

Referring to FIG. 2, there is provided a reception signal input terminal 7 to which there is supplied a reception signal obtained via a demodulator (not shown) in the time division multiple access system shown in FIGS. 1A, 1B and 1C. The reception signal supplied to the reception signal input terminal 7 is modulated according to a GMSK (Gaussian minimum shift keying) modulation system when the input signal is the GMSK signal. This reception signal is converted into a baseband signal by a demodulator in the high frequency transmission system. Therefore, the reception signal will hereinafter be referred to as a baseband signal in order to understand the present invention more clearly.

As shown in FIG. 2, the reception signal supplied to the reception signal input terminal 7 is supplied through an equalizer 3 formed of a transversal filter to an output terminal 8. This transversal filter 3 is comprised of n delay circuits $D_1, D_2, \ldots, D_n$, multipliers for multiplying n+1 tap coefficients $C_0, C_1, C_2, \ldots, C_n$ and an adder 3a. This transversal filter 3 is similar to a conventional transversal filter.

The reception signal obtained at the input terminal 7 is supplied to a sync. (synchronizing) data detecting circuit 1 which detects the sync. data portion (see FIG. 1B) of the input reception signal and an impulse response estimating circuit 5.

The sync. data detecting circuit 1 is adapted to detect sync. data by comparing and correlating a sync. pattern supplied thereto and a sync. pattern from a sync. pattern table 9 in which there is stored a previously-designated sync. pattern.

The sync. data portion of the reception signal obtained at the output side of the sync. data detecting circuit 1 is supplied to an error estimating circuit 2 and the impulse response estimating circuit 5.

The error estimating circuit 2 is supplied with the previously-designated sync. pattern data from the sync. pattern table 9 and also an output signal from the equalizer 3. The error estimating circuit 2 sequentially updates the tap coefficients $C_0, C_1, C_2, \ldots C_n$ of the transversal filter 3 that constructs the equalizer from the tap coefficient determining circuit 4 by effectively utilizing an LMS (least means square) algorithm or RLS (recursive least squares) algorithm. When the LMS algorithm is used, the tap coefficients are updated in accordance with the following procedures.

$$C_j(n+1) = C_j(n) - \alpha \cdot \sum_{k=1}^{k} y_{k-j} e(k) \quad (1)$$

where j is the jth tap of the transversal filter, n is the nth updating when the tap coefficient is updated n times, $\alpha$ is the step gain $(0<\alpha\leq 1)$, K is the number of averaging in the process for averaging the estimation error, y is the sample value of the reception signal input to the equalizer 3, and e is the equalizing error.

$$e = e_{out} - a$$

where $e_{out}$ is the output signal of the equalizer and a is the reference signal.

The sync. pattern from the sync. pattern table 9 is supplied to the impulse response estimating circuit 5. The impulse response estimating circuit 5 calculates a cross-correlation function between the sync. data portion of the reception signal and the sync. pattern (SYNC pattern).

$$r(kT) = \sum_{i=-m}^{+h} x(iT) \cdot y[(i/k)T] \quad (2)$$

where x(iT) is the sync. pattern, h(iT) is the impulse response, and T is the duration of one symbol. In the receiver side, the sync. pattern x(iT) and the reception signal y(iT) are known.

In this case, an impulse response of the transmission system interposed between the transmitter and the receiver is shown in FIG. 4. When one sequence of 8 kinds of patterns in the GSM system is equal to the sync. pattern (SYNC pattern) (corresponding to FIG. 1) of FIG. 4, the sync. pattern portion of the reception signal is expressed by the following equation:

$$y(kT) = \sum_{i=-m}^{+n} x(iT) \cdot h[(k-i)T] \quad (3)$$

The normalization is carried out by using a maximum value of the cross-correlation function value provided by the equation (2). The cross-correlation functions calculated as described above are illustrated in FIG. 4. As will be clear from the comparison between the impulse response and the cross-correlation function shown in FIG. 4, the impulse response can be estimated from the cross-correlation function.

The cross-correlation function from the impulse response estimating circuit 5 is supplied to an initial value determining circuit 10. In the initial value determining circuit 10, the cross-correlation function supplied thereto is processed with a Fourier transform and the obtained result is set to R(f). A transfer characteristic of an inverse filter is obtained from R(f):

$$E(f) = 1/R(f)$$

The transfer characteristic of this inverse filter is processed with an inverse Fourier transform. An output value of the inverse filter is used as an initial value of the tap coefficients $C_0, C_1, C_2, \ldots, C_n$ of the transversal filter 3 that constructs the equalizer. This initial value is supplied to the respective multipliers of the transversal filter 3 via the tap coefficient determining circuit 4.

Although it is sufficient that the initial value may be set at the time the receiver is energized in use, the initial value may be set at every frame or at every several frames.

Operation of the apparatus for automatic equalizing filter shown in FIG. 2 will be described with reference to a flowchart forming FIG. 3.

Figure 3:
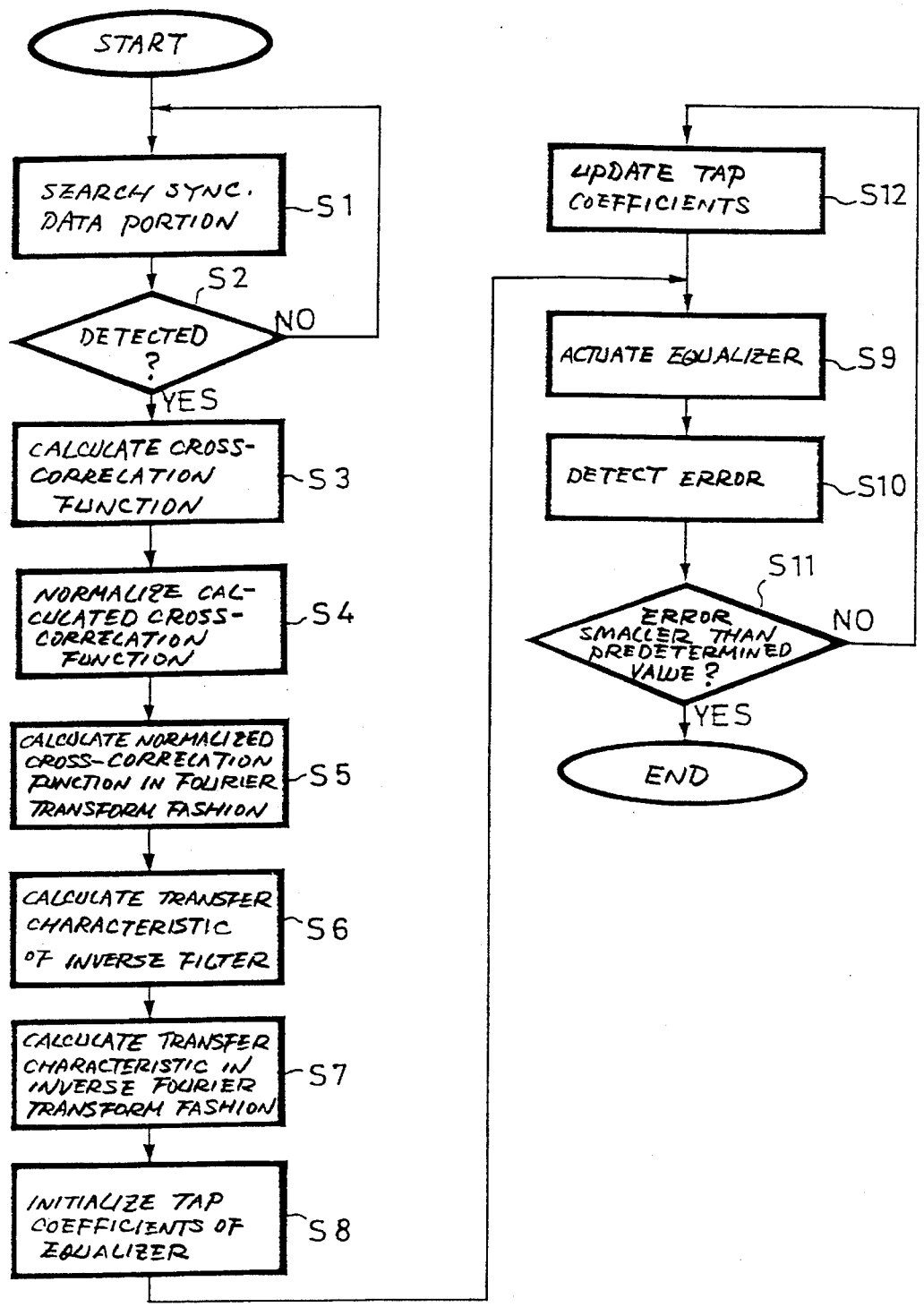
FIG. 3 is a flowchart to which reference will be made in explaining operation of the apparatus for automatic equalizing filter shown in FIG. 2.

As shown in FIG. 3, following the start of operation, when the reception is started by the receiver using the apparatus for automatic equalizing filter according to this embodiment, the sync. data portion of the reception signal is searched by the sync. data detecting circuit 1 at steps S1, S2. If the sync. data portion is not detected as represented by a NO at decision step S2, then the processing returns to step S1, whereat the search operation is continued. If on the other hand the sync. data portion is detected as represented by a YES at decision step S2, then the processing goes to the next step S4, whereat a mutual correlation function between the sync. data portion of the reception signal and the previously-designated sync. pattern from the sync. pattern table 9 is calculated by the impulse response estimating circuit 5. Thereafter, the calculated cross-correlation function is normalized by the initial value determining circuit 10 at step S4.

In the next step S5, the cross-correlation function normalized by the initial value determining circuit 10 is calculated with a Fourier transform, whereafter the transfer characteristic of the inverse filter is calculated from the resultant value, R(f) at step S6.

In the next step S7, the transfer characteristic of the inverse filter with calculated in an inverse Fourier transform and the calculated result is set to an initial value of the tap coefficient. Then, the tap coefficient of the transversal filter 3 constructing the equalizer is initialized by using the aforesaid initial value via the tap coefficient determining circuit 4 at step S8.

In the next step S9, the transversal filter 3 serving as the equalizer is actuated. After the transversal filter 3 is actuated, the error estimating circuit 2 detects an error of the tap coefficient of the transversal filter 3 on the basis of the output signal from the transversal filter 3, the sync. data portion and the sync. pattern at step S10. If the detected error is larger than a predetermined value as represented by a NO at decision step S11, then the tap coefficients $C_0, C_1, C_2, \ldots, C_n$ of the transversal filter 3 are updated on the basis of the foregoing equation (1) at step S12. If the error is smaller than the predetermined value as represented by a YES at decision step S11, then the processing is ended.

According to this embodiment, the cross-correlation function between the sync. data portion of the reception signal and the previously-designated sync. pattern is calculated, the impulse response is estimated from this cross-correlation function and then the initial values of the tap coefficients $C_0, C_1, C_2, \ldots, C_n$ of the transversal filter 3 are set. Therefore, this initial value is extremely close to the optimum value. There is then the advantage that the tap coefficients $C_0, C_1, C_2, \ldots, C_n$ of this transversal filter 3 can be converged at high speed with high accuracy by with minimal calculation.

Figure 5:
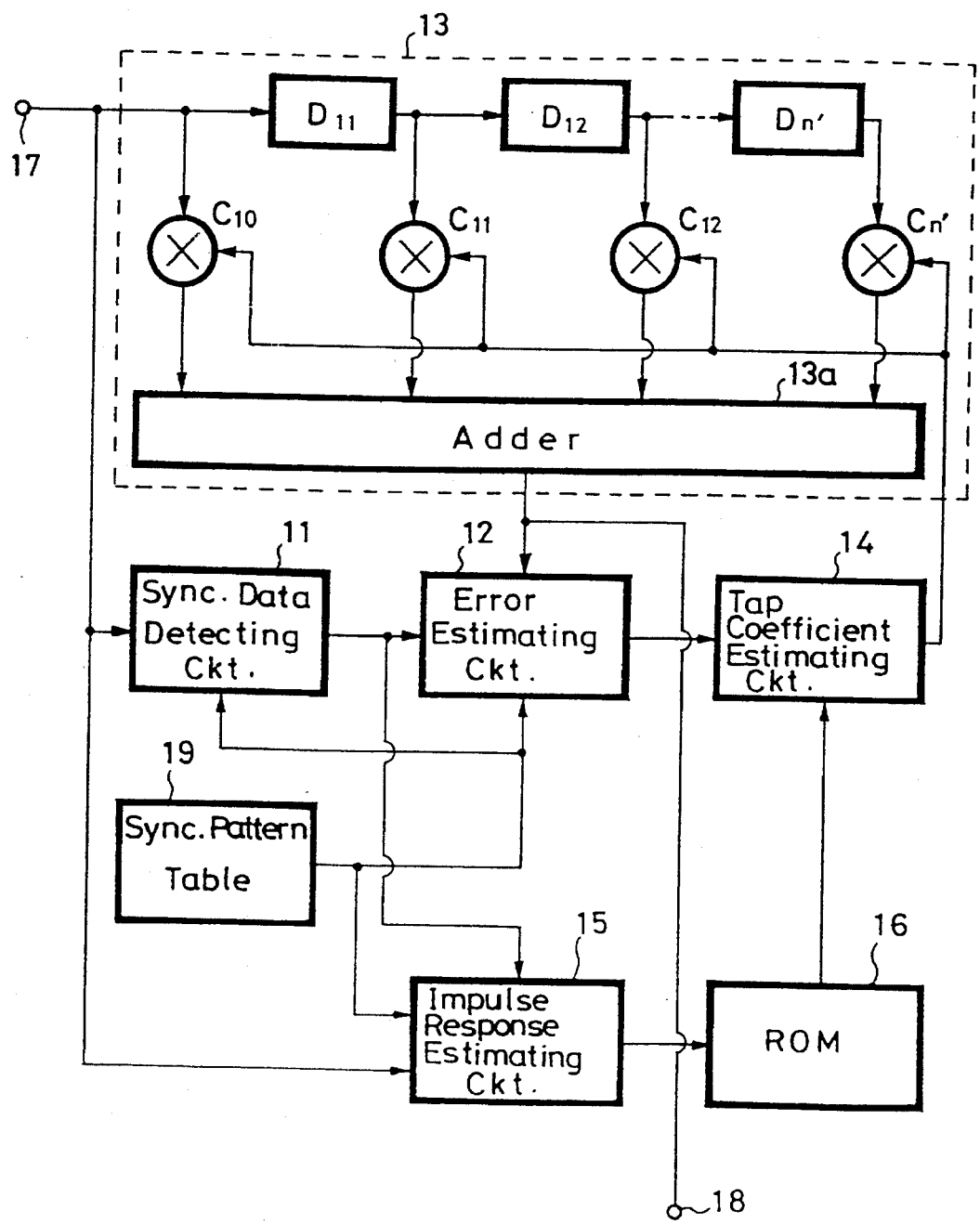
FIG. 5 is a block diagram showing a circuit arrangement of the automatic equalizing filter used in the time division multiple access system according to another embodiment of the present invention.

FIG. 5 shows the apparatus for automatic equalizing filter according to a second embodiment of the present invention.

As shown in FIG. 5, a reception signal supplied to a reception signal input terminal 17 is supplied through a transversal filter 13 connecting the equalizer to an output terminal 18. The reception signal applied to the input terminal 17 is supplied to a sync. data detecting circuit 11 which detects a sync. data portion and also to an impulse response estimating circuit 15.

The sync. data portion of the reception signal obtained at the output side of a sync. data detecting circuit 11 is supplied to an error estimating circuit 12 and the impulse response estimating circuit 15.

The error estimating circuit 12 is supplied with a previously-designated sync. pattern from a sync. pattern table 19 and the output signal from the equalizer 13. Therefore, the error estimating circuit 12 sequentially updates tap coefficients $C_{10}, C_{11}, C_{12}, \ldots, C_{n'}$ of the transversal filter 13 constructing the equalizer from a tap coefficient determining circuit 14 by effectively utilizing the LMS algorithm or RLS algorithm. When the LMS algorithm is used, for example, the error estimating circuit 12 updates the tap coefficients $C_{10}, C_{11}, C_{12}, \ldots, C_{n'}$ in accordance with the procedure shown in the foregoing equation (1).

The sync. pattern from the sync. pattern table 19 is supplied to the impulse response estimating circuit 15. The impulse response estimating circuit 15 calculates a cross-correlation function between the sync. data portion of the reception signal and the sync. pattern on the basis of the foregoing equation (2).

The normalization is carried out by using a maximum value of the cross-correlation function obtained by the impulse response and then the impulse response is estimated. The impulse response thus estimated is supplied to a ROM (read-only memory) 16 constructing a memory apparatus as an address signal.

Figure 6A:
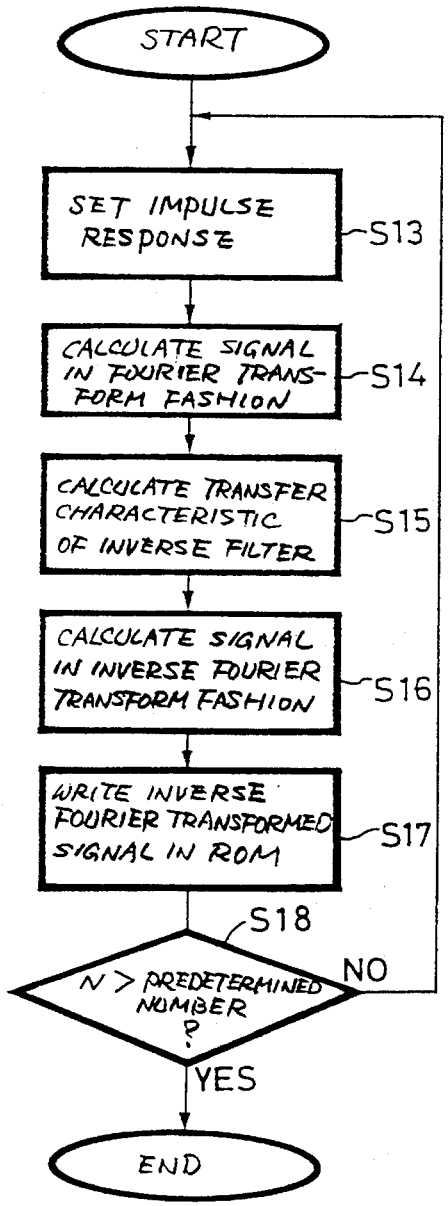
FIGS. 6A and 6B are flowcharts to which reference will be made in explaining operation of the automatic equalizing filter shown in FIG. 5, respectively.

In the ROM 16 are stored the tap coefficients $C_{10}, C_{11}, C_{12}, \ldots, C_{n'}$ of the transversal filter 13 corresponding to the cross-correlation function and in which the cross-correlation function is set as an address signal in accordance with the procedure shown in FIG. 6A.

A processing in which the tap coefficients $C_{10}, C_{11}, C_{12}, \ldots, C_{n'}$ are stored in the ROM 16 will be described with reference to a flowchart forming FIG. 6A. As shown in FIG. 6A, following the start of operation, in step S13, let us assume impulse responses of a predetermined number that can exist. In the next step S14, the impulse response thus assumed is calculated using a Fourier transform and the calculated result is expressed as I(f).

In the next step S15, a transfer characteristic of an inverse filter is calculated from I(f).

$$E(f)=1/I(f)$$

In the next step S16, the transfer characteristic of the inverse filter is calculated using an inverse Fourier transform. At the next step S17, the signal thus calculated with the inverse Fourier transform is stored in the ROM 16 so that this signal can be read out therefrom by using the aforementioned impulse response.

It is determined at the next decision step S18 whether or not the number N of the impulse responses is larger than a predetermined value. If the number N of the impulse responses is larger than the predetermined value as represented by a YES, then the processing is ended. If the number N of the impulse responses is not larger than the predetermined value as represented by a NO at decision step S18, then steps S13 to S17 are repeated.

According to this embodiment, the tap coefficients $C_{10}, C_{11}, C_{12}, \ldots, C_{n'}$ read out from the ROM 16 under the condition that the impulse response from the impulse response estimating circuit 15 is used as the address signal are respectively supplied through the tap coefficient determining circuit 14 to the multipliers of the transversal filter 13 as initial values of the tap coefficients $C_{10}, C_{11}, C_{12}, \ldots, C_{n'}$. The rest of the arrangement of the apparatus for automatic equalizing filter is similar to that of FIG. 2.

Operation of the apparatus for automatic equalizing filter according to the second embodiment of the present invention shown in FIG. 5 will be described with reference to a flowchart of FIG. 6B.

Figure 6B:
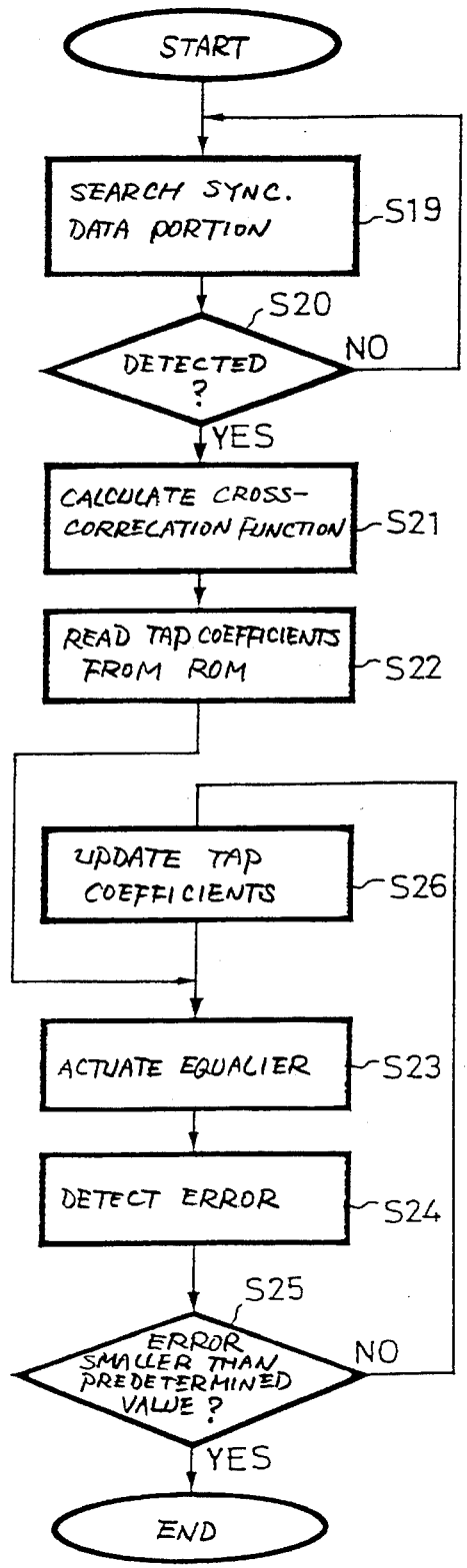

As shown in FIG. 6B, following the start of operation, when a reception is started by a receiver using the apparatus for automatic equalizing filter, the sync. data portion of the reception signal is searched by the sync. data detection circuit 11 at step S19. It is determined in the next decision step S20 whether or not the sync. data portion of the reception signal is detected. If the sync. data portion is not detected as represented by a NO at decision step S20, then the processing returns to step S19 and the step S19 is repeated. If on the other hand the sync. data portion is detected by a YES at decision step S20, then the processing proceeds to step S21, whereat a cross-correlation function between the sync. data portion of the reception signal and the sync. pattern from the previously-designated sync. pattern table 19 is calculated by the impulse response estimating circuit 15 and then the normalization is carried out by using the maximum value of this cross-correlation function.

The cross-correlation function obtained by the impulse response estimating circuit 15 corresponds to the estimated impulse response. By using the impulse response thus estimated as the address signal, the tap coefficients $C_{10}$, $C_{11}$, $C_{12}$, ..., $C_n$ stored in the ROM 16 are read out therefrom at step S22. These read-out values are used as initial values of the tap coefficients of the transversal filter 13.

Operation of the transversal filter 13 serving as the equalizer is started at step S23. After the transversal filter 13 is actuated, an error of the tap coefficients of the transversal filter 13 is detected on the basis of the output signal from the transversal filter 13, the sync. data portion and the sync. pattern at step S24. It is determined at the next decision step S25 whether or not this error is smaller than a predetermined value. If the error is larger than the predetermined value as represented by a NO at decision step S25, then the processing proceeds to step S26 whereat the tap coefficients $C_{10}$, $C_{11}$, $C_{12}$, ..., $C_{n'}$ are updated. If on the other hand this error is smaller than the predetermined value as represented by a YES at decision step S25, then the processing is ended.

According to this embodiment, the cross-correlation function between the sync. data portion of the reception signal and the previously-estimated sync. pattern is calculated, and the impulse response is estimated from this cross-correlation function. Then, by using the thus estimated impulse response as the address signal, the tap coefficients $C_{10}$, $C_{11}$, $C_{12}$, ..., $C_{n'}$ of the transversal filter 13 previously stored in the ROM 16 are read out therefrom and used as initial values of the transversal filter 13. Thus, since the calculated amount for setting the initial values is extremely small and these initial value are extremely close to the optimum value. There is then the advantage that the tap coefficients $C_{10}$, $C_{11}$, $C_{12}$, ..., $C_{n'}$ can be converged at high speed with high accuracy by a small amount of calculation.

While the transversal filter is used as the equalizer as described above, the present invention is not limited thereto and other digital filters can of course be used instead of the transversal filter.

According to the present invention, the tap coefficients of the equalizer can be converged at high speed with high accuracy by a small number of calculations.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. An automatic equalizing filter for a time division multiple access system, comprising:

a reception signal input for receiving a reception signal;

synchronizing data detecting means for detecting a synchronizing data portion from a data sequence of said reception signal, said synchronizing data detecting means receiving said reception signal from said reception signal input;

an equalizer having tap coefficients, said equalizer receiving said reception signal from said reception signal input, said equalizer also receiving values of said tap coefficients;

wherein said data sequence is arranged in frames and wherein initial values of said tap coefficients of said equalizer are set at every predetermined number of frames;

tap coefficient determining means for determining said tap coefficients of said equalizer, said tap coefficient determining means receiving an error signal, said tap coefficient determining means providing said values of said tap coefficients to equalizer;

error estimating means receiving said synchronizing data portion from said synchronizing data detecting means, a previously-designated synchronizing pattern and the output signal from said equalizer, said error estimating means providing said error signal to said tap coefficient determining means;

impulse response estimating means for estimating an impulse response from a cross-correlation function between said synchronizing data portion and said previously-designated synchronizing pattern;

initial value determining means for generating said initial values of said tap coefficients of said equalizer, wherein said cross-correlation function is received from said impulse response estimating means and processed to provide said initial values to said tap coefficient determining means;

wherein said cross-correlation function is processed using a Fourier transform to calculate an inverse filter transfer characteristic, said inverse filter transfer characteristic is processed using an inverse Fourier transform to produce output values, and said output values are employed as said initial values of said tap coefficients of said equalizer.

2. An automatic equalizing filter for a time division multiple access system according to claim 1, wherein said initial value determining means further comprises a memory; and wherein said tap coefficients of said equalizer corresponding to the cross-correlation function between said synchronizing data portion and said synchronizing pattern in said impulse response estimating means are calculated in advance, said tap coefficients are stored in said memory and said tap coefficients as said initial values of said equalizer are set by reading said tap coefficients from said memory on the basis of said cross-correlation function calculated by said impulse response estimating means upon reception of said reception signal.

3. An automatic equalizing filter for a time division multiple access system according to claim 1, wherein said equalizer is comprised of a transversal filter.

4. An automatic equalizing filter for a time division multiple access system, comprising:

a reception signal input for receiving a reception signal;

synchronizing data detecting means for detecting a synchronizing data portion from a data sequence of said reception signal, said synchronizing data detecting means receiving said reception signal from said reception signal input;

a transversal filter equalizer having tap coefficients, said equalizer receiving said reception signal from said reception signal input, said equalizer also receiving values of said tap coefficients;

tap coefficient determining means for determining said tap coefficients of said equalizer, said tap coefficient determining means receiving an error signal;

wherein said data sequence is arranged in frames and wherein initial values of said tap coefficients of said equalizer are set at every frame;

impulse response estimating means for estimating an impulse response from a cross-correlation function between said synchronizing data portion and previously-designated synchronizing pattern;

initial value determining means for generating said initial values of said tap coefficients of said equalizer, wherein said cross-correlation function is received from said impulse response estimating means and processed to provide said initial values to said tap coefficient determining means;

wherein said cross-correlation function is processed using a Fourier transform to calculate an inverse filter transfer characteristic, said inverse filter transfer characteristic is processed using an inverse Fourier transform to produce output values, and said output values are employed as said initial values of said tap coefficients of said equalizer; and said initial value determining means includes a memory, wherein said tap coefficients of said equalizer corresponding to the cross-correlation function between said synchronizing data portion and said synchronizing pattern in said impulse response estimating means are calculated in advance, said tap coefficients are stored in said memory and said tap coefficients as said initial values of said equalizer are set by reading said tap coefficients from said memory on the basis of said cross-correlation function calculated by said impulse response estimating means upon reception of said reception signal.

5. A method for providing an automatic equalizing filter for a time division multiple access system, comprising the steps of:

detecting a synchronizing data portion from a data sequence of a reception signal, wherein said data sequence is arranged in frames;

providing a transversal filter equalizer having tap coefficients, said equalizer receiving said reception signal, said equalizer also receiving values Of said tap coefficients;

estimating an impulse response from a cross-correlation function between said synchronizing data portion and a previously-designated synchronizing pattern;

setting initial values of said tap coefficients at a predetermined number of said frames by processing said cross correlation function;

determining said tap coefficients of said equalizer on the basis of said initial values;

wherein said cross-correlation function is processed using a Fourier transform to calculate an inverse filter transfer characteristic, said inverse filter transfer characteristic is processed using an inverse Fourier transform to produce output values, and said output values are employed as said initial values of the tap coefficients of said equalizer.

6. The method of claim 5, wherein said tap coefficients of said equalizer corresponding to the cross-correlation function between said synchronizing data portion and said synchronizing pattern in said impulse response estimating step are calculated in advance, and further including the steps of:

storing said tap coefficients in a memory; and setting said tap coefficients as said initial values of said equalizer by reading said tap coefficients from said memory on the basis of said cross-correlation function calculated by said impulse response estimating step.

* * * * *